United States Patent [19]
Barnes et al.

[11] Patent Number: 5,433,258
[45] Date of Patent: Jul. 18, 1995

[54] GETTERING OF PARTICLES DURING PLASMA PROCESSING

[75] Inventors: Michael S. Barnes, Mahopac; Dennis K. Coultas, Hopewell Junction; John C. Forster; John H. Keller, both of Poughkeepsie; James A. O'Neill, New City, all of N.Y.

[73] Assignee: International Business Machines Corporation, Armonk, N.Y.

[21] Appl. No.: 191,894

[22] Filed: Feb. 4, 1994

Related U.S. Application Data

[63] Continuation of Ser. No. 785,628, Oct. 31, 1991, Pat. No. 5,332,441.

[51] Int. Cl.$^6$ .................. C23C 16/30; C23C 16/50; C23C 14/34; H05H 1/00
[52] U.S. Cl. .................. 156/643.1; 156/345; 204/192.12; 204/192.32; 427/569; 427/571
[58] Field of Search .................. 118/723 E, 620; 427/569, 571; 437/10; 204/298.31, 192.12, 192.32; 156/643, 345

[56] References Cited

U.S. PATENT DOCUMENTS

| | | |
|---|---|---|
| 4,369,205 | 1/1983 | Winterling et al. .................. 427/569 |
| 4,492,610 | 1/1985 | Okano et al. . |
| 4,645,546 | 2/1987 | Matsushita . |
| 4,818,359 | 4/1989 | Jones et al. . |
| 4,931,405 | 6/1990 | Kamijo et al. . |

FOREIGN PATENT DOCUMENTS

| | | | |
|---|---|---|---|
| 0334109 | 9/1989 | European Pat. Off. ............ | 427/571 |
| 2237117A | 9/1990 | Japan .................. | 427/571 |

OTHER PUBLICATIONS

John H. Keller et al., The Transport of Dust Particles in Glow Discharge Plasmas, International Business Machines Corporation.

*Primary Examiner*—R. Bruce Breneman
*Assistant Examiner*—Jonathan D. Baskin
*Attorney, Agent, or Firm*—Whitham, Curtis, Whitham & McGinn; Charles W. Peterson, Jr.

[57] ABSTRACT

Apparatus and methods for plasma processing involving the gettering of particles having a high charge to mass ratio away from a semiconductor wafer are disclosed. In one aspect of the invention, magnets are used to produce a magnetic field which is transverse to an electric field to draw the negative particles away from the wafer to prevent the formation of a sheath which can trap the particles. In a second aspect of the invention, a power source is connected to the wafer electrode to maintain a negative charge on the wafer, thereby preventing negative particles from being drawn to the wafer surface when the plasma is turned off. In other embodiments of the invention, a low density plasma source is used to produce a large plasma sheath which permits particles to cross a chamber to be gettered. A low density plasma discharge followed by a pulse to a higher density is used to overcome the negative effect of an insulating layer between the wafer and the wafer electrode.

9 Claims, 4 Drawing Sheets

GETTERING OF PARTICLES DURING PLASMA PROCESSING

This is a continuation of application Ser. No. 07/785,628, filed Oct. 31, 1991, now issued as U.S. Pat. No. 5,332,441.

BACKGROUND OF THE INVENTION

1. Field of the invention

The present invention generally relates to reducing particle contamination on semiconductor wafers during plasma processing and, more particularly, to gettering charged particles during plasma processing.

2. Description of the Prior Art

In the manufacture of integrated circuits (ICs), semiconductor wafers of silicon (Si) are subjected to several processes. Some of these processes involve a plasma (e.g., etching, plasma deposition and sputtering). Radio frequency (RF) and DC Glow discharge plasmas, for example, are extensively utilized in the manufacture of ICs. Both electropositive and electronegative gases are used to produce plasmas. Electronegative gases, defined as those having a higher ion density than electron density, such as $CF_4$, $CHF_3$, $Cl_2$, HBr or $O_2$, present difficult contamination problems for semiconductor manufacturers.

Contaminating particles ranging in size from tenths of microns to microns are produced or grown in the plasmas. The particles normally have a negative charge, and one growth mechanism is thought to involve negative ions which are trapped in the plasma by plasma sheaths. Plasma sheaths form where the plasma comes in contact with a solid and act as a boundary layer between the plasma and solid surface. The size of the sheath is inversely related to plasma density.

Increasing densities of semiconductor circuits make contamination a serious problem to product reliability and may even be a barrier to achieving theoretically possible higher density circuits. It is therefore necessary to provide a way to reduce particle contamination on semiconductor wafers during plasma processing.

SUMMARY OF THE INVENTION

It is therefore an object of the present invention to provide methods for reducing particle contamination on wafers which may occur during plasma processing.

According to the invention, several methods and apparatus for gettering particles during plasma processing are provided.

A first aspect of the invention is to expose the plasma to a positive potential such that a normal sheath cannot form, thus allowing the negative particles to be drawn to the positive potential. This is done by using magnets or magnet coils to produce a magnetic field which is everywhere nearly transverse (i.e., perpendicular) to the electric field.

A second aspect of the invention relates to the problem of negative particles being in a potential well and, therefore, not being gettered by the above mechanism. If potential wells exist for the particles and the wafer is on the most negative electrode, then at periods which are short compared to the process time, the plasma is turned off for a period that is long compared to the plasma decay time. This lowers the potential wells allowing the particles to be swept out to the positive electrode as the plasma decays. If the wafer is not on the most negative electrode, it can be pulsed negative while the plasma RF power is off.

In a third aspect of the invention, means is provided to maintain a negative charge on the wafer while the plasma is turned off. The negative bias on the wafer electrode can be accomplished using a DC power source or a farce capacitor connected to the wafer electrode through an RF choke. This prevents the wafer from developing a positive potential and attracting negative particles before they can be swept out to the chamber walls.

In a fourth aspect of the invention, a low frequency, low power RF source is connected to either the wafer electrode or to an auxiliary electrode. The RF source is energized for a short time before or after termination of the main plasma discharge. The low power RF energy produces a less dense plasma while the main plasma is turned off. The less dense plasma results in larger sheaths which permit particles to cross the chamber to be gettered.

In a fifth aspect of the invention, the RF waveform powering the wafer electrode and generating the plasma is pulsed in a manner to maintain a low density plasma for a long enough period of time to reduce the amount of stored charge in the plasma and to reduce the depth of the particle traps. After the low density plasma has been established for the requisite amount of time, the discharge is briefly pulsed to a higher density, thereby driving the substrate electrode to a negative potential which will push particles to the chamber walls when the plasma is turned off.

Any of the foregoing methods can be combined for optimum sweep out and gettering of both negative particles and the precursors to particles. These methods also can be used to sweep out particles which the plasma removes from the wafer by electron and ion bombardment. In addition, these methods can be used to sweep out flakes which come off the wall both when the plasma is on and when it is off. In electropositive discharges, low power, low frequency RF can be used to maintain the substrate at a negative bias when the main RF source is turned off, thus forcing particles to the walls or gettering device.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

Figure 1:
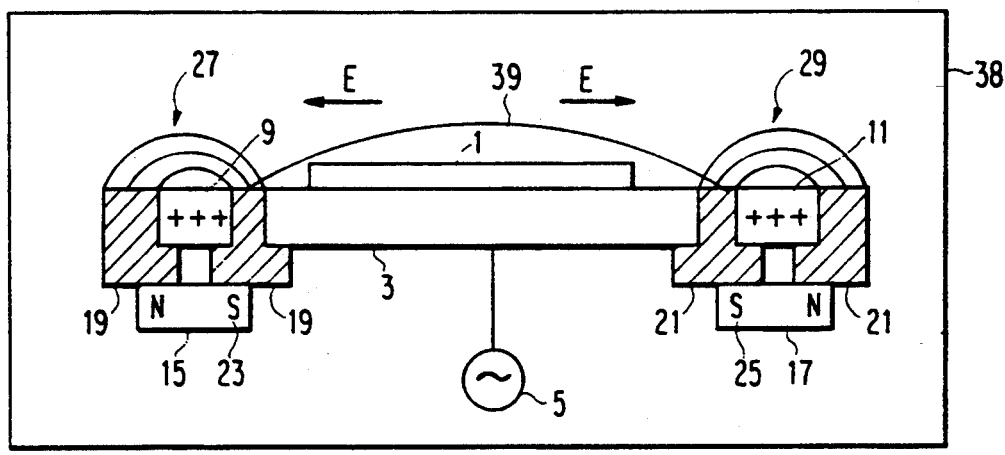
FIG. 1 is a cross-sectional side view of a particle gettering apparatus which utilizes magnets or magnetic coils.

Referring now to the drawings and, more particularly to FIG. 1, a gettering apparatus in accordance with a first embodiment of the present invention is shown. A wafer 1 is loaded on a wafer electrode 3, located between a set of parallel positive electrodes 9 and 11 in a chamber 38. The wafer electrode 3 is insulated from the positive electrodes 9 and 11 by insulators 19, 21. A set of magnets or magnet coils 15 and 17 is located below the positive electrodes 9 and 11. Arc shaped magnetic fields 27 and 29 are generated by magnets 15 and 17. The magnetic fields 27 and 29 are nearly transverse to the electric field E. The integral of the magnetic fields 27 and 29 with the distance along the electric field E should be large compared to the 50–100 Gauss*cm range. Typically, magnetic fields which are over 75 Gauss*cm are sufficient to prevent high energy electrons from being drawn toward the positive electrodes, thereby preventing formation of a normal plasma sheath 39. While electrons cannot reach the positive electrodes 9 and 11, the larger particles which have a high charge to mass ratio can pass through the magnetic fields 27 and 29 and be gettered by the positive electrodes 9 and 11.

Figure 2:
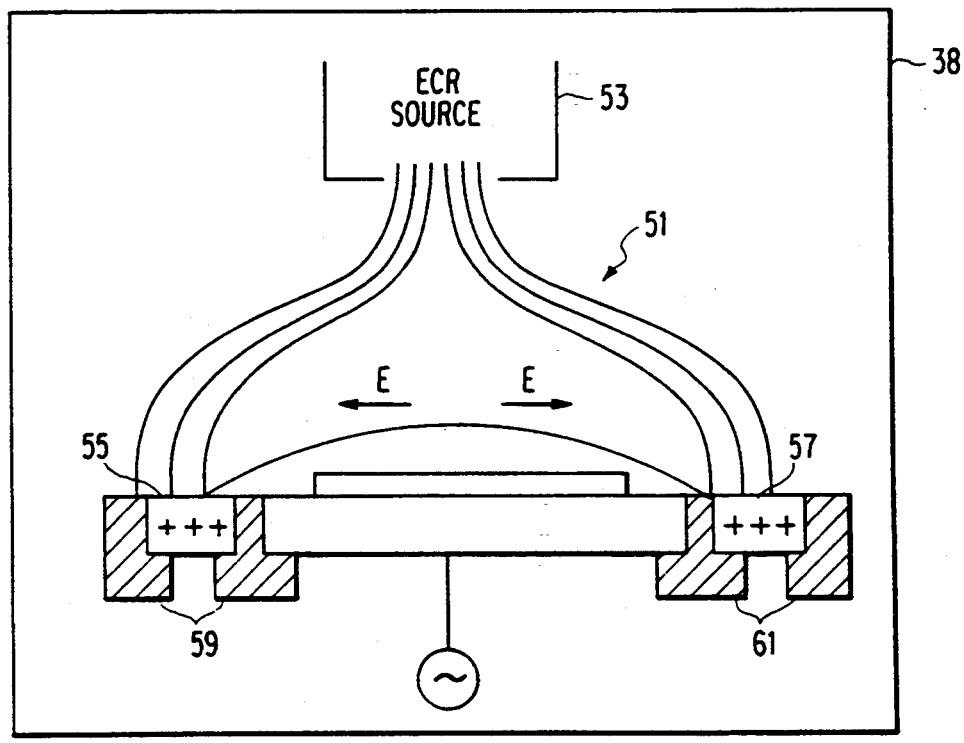
FIG. 2 is a cross-sectional side view of a particle gettering apparatus which utilizes an Electron Cyclotron Resonance (ECR) source to generate a magnetic field.

FIG. 2 shows an alternative configuration to using the magnets 15 and 17. Specifically, an ECR type system may be used to generate a magnetic field which is nearly transverse to the electric field E. For deposition of dielectric material, positive electrodes 55 and 57 and related insulators 59 and 61 should be designed so that the surface of the dielectric material on electrodes 55 and 57 will not conduct to the positive electrodes 55 and 57 by being exposed to vacuum UV from the plasma.

Figure 3:
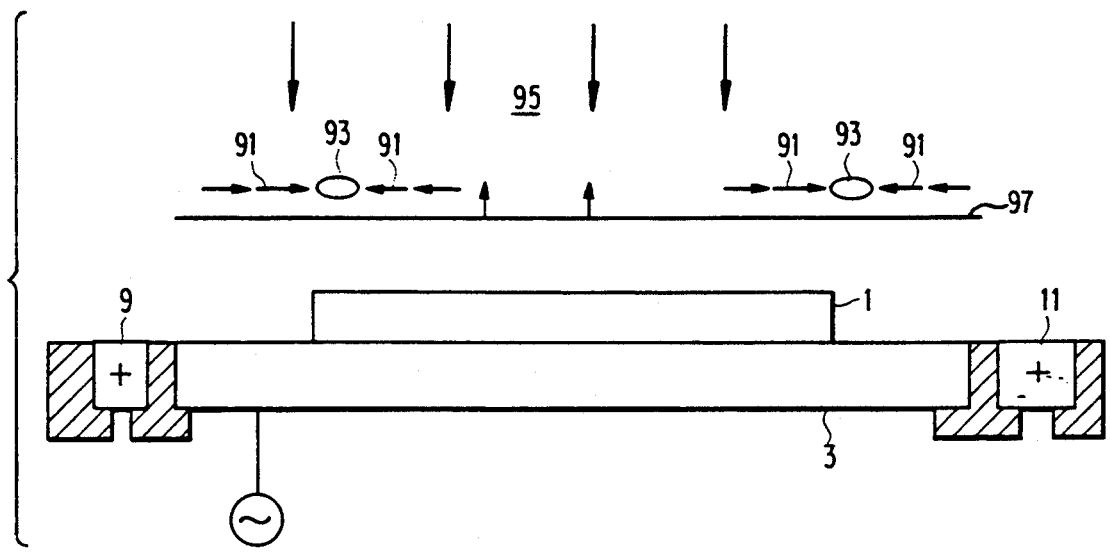
FIG. 3 is a cross-sectional side view of a wafer during plasma processing and the forces acting in a plasma sheath which create potential wells.

A problem incurred during a gettering procedure is that of potential wells. As shown in FIG. 3, potential wells are created when forces in the plasma drive particulates to regions 93 of the plasma sheath 97 where the vertical forces 95 are in balance. Lateral forces 91 then act on the particulates in these regions 93 to maintain clusters, or potential wells. When the wafer 1 is on the most negative electrode in the chamber 38, as shown in FIGS. 1 or 2, the particles may be swept out to the positive electrodes 9 and 11 as the plasma decays by turning off the plasma for a period which is long compared to the plasma decay time. For example, when plasma decay time is less than a millisecond, the plasma may be turned off for every second to tenth of a second. Turning off the plasma periodically reduces the plasma density and enlarges the plasma sheaths which allows the particles to move out of the potential wells to the electrodes. If the wafer is not on the most negative electrode, as would be the case if the chamber has an auxiliary negative electrode for producing a low power plasma, as shown in FIG. 8, the wafer electrode 3 can be pulsed negative by an auxiliary power source while the plasma power is off.

Figure 4:
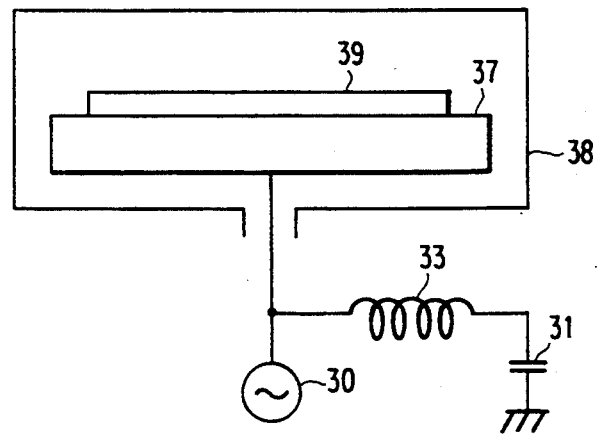
FIG. 4 is a cross-sectional side view of a particle gettering apparatus in which a capacitor is connected to the wafer electrode through an RF choke coil to maintain a negative charge on the wafer when the plasma discharge is turned off.
Figure 5:
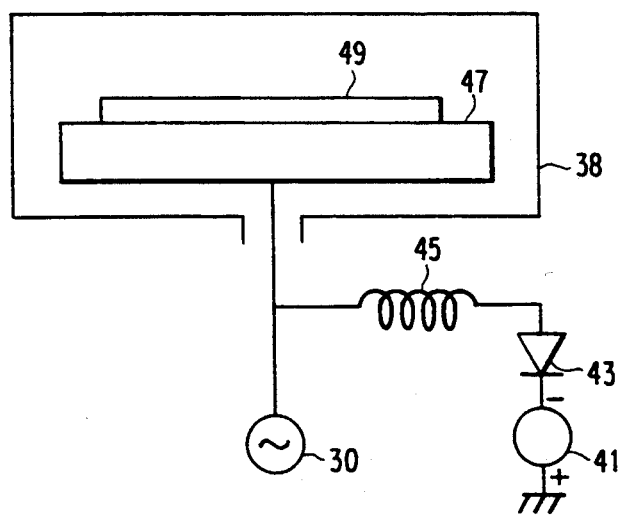
FIG. 5 is a cross-sectional side view of a particle gettering apparatus in which a DC power supply is connected to the wafer electrode through an RF choke coil to maintain a negative charge on the wafer when the plasma discharge is turned off.

The inventors have discovered that when the plasma power is turned off, the wafer experiences a positive transient towards the plasma potential, even when the wafer has a large negative self bias. Hence, as the plasma decays, the wafer has a positive voltage (@+10 V) which attracts the negative particles. To counter the natural tendency of the wafer moving toward a positive voltage, it has been found advantageous to bias the wafer electrode negative at the time the plasma power is turned off. FIGS. 4 and 5 show alternative schemes for providing the negative bias to the wafer electrode at the time the plasma is terminated. FIG. 4 shows a capacitor 31 connected to the negative electrode 37 on which the substrate 39 rests through a choke coil 33. When the power 30 is turned off, the stored negative charge in the capacitor 31 biases the electrode 37 negative. The negative charge on the capacitor must be comparable to the stored positive charge in the discharge. FIG. 5 shows an active means for biasing the wafer electrode 47 negative which includes a negative DC supply 41 connected to the electrode 47 through a diode 43 and choke 45. When the electrode 47 experiences the positive turn-off transient, it is clamped to the voltage of the negative DC supply 41. Further, both the passive (capacitor) and active (power supply) techniques can be used simultaneously in order to keep the charge on an insulator on the wafer at a minimum while at the same time keeping the wafer 49 at a negative potential while the discharge plasma is turned off.

Figure 6:
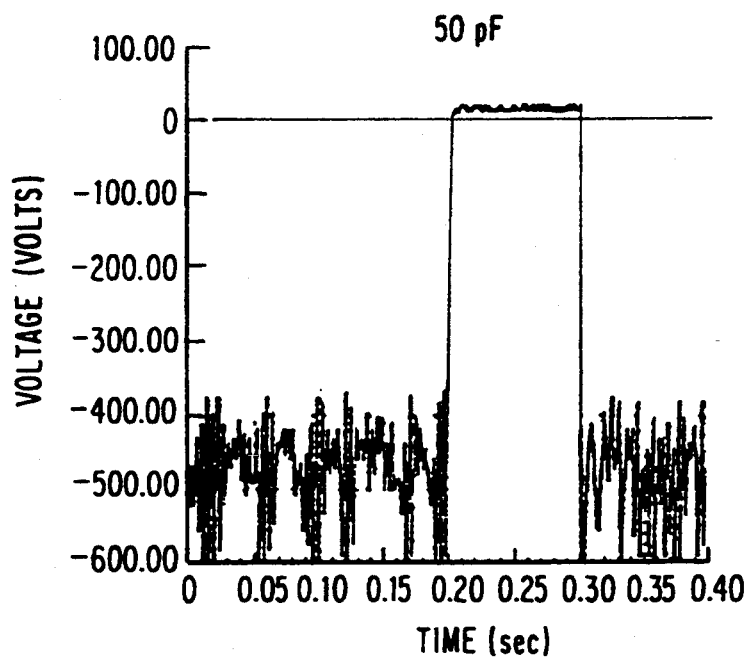
FIG. 6 is a graph showing a positive transient which occurs on the wafer at the time the plasma discharge is turned off.
Figure 7:
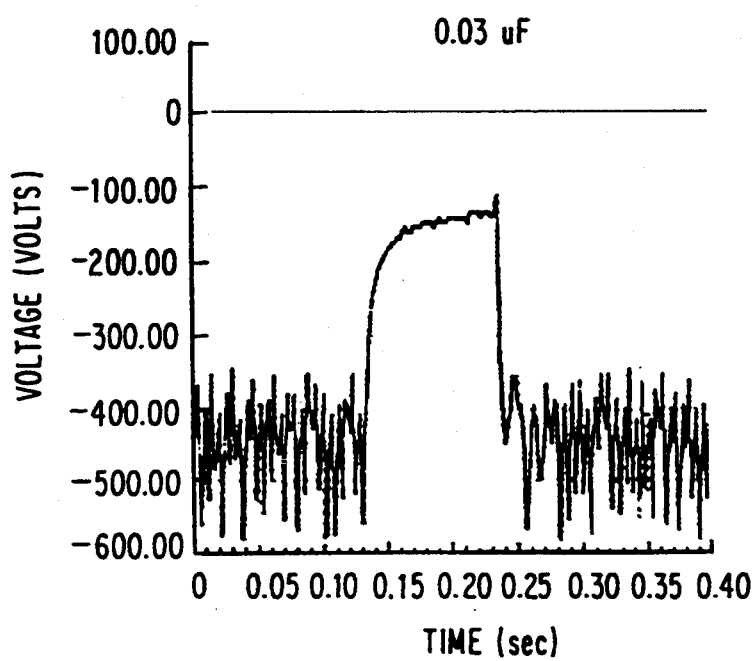
FIG. 7 is a graph showing a reduced positive transient compared to FIG. 6 when a large capacitor is connected to the wafer electrode as in FIG. 4.

In a test experiment, a 50 pF capacitance was located between the electrode and ground in an arrangement like that shown in FIG. 4 and, the wafer was subjected to a particle forming etch plasma. FIG. 6 shows a plot of wafer voltage versus time when the plasma discharge was turned off. The positive turn off transient occurred at time=0.20 seconds. After viewing the wafer under a microscope, particles were observed on the wafer both during and after the etch process. FIG. 7 shows a similar plot of a turn off transient; however, for the substrate of FIG. 7, a 0.03 μF capacitor was connected between the wafer electrode and ground. As can be seen from FIG. 7, the transient did not extend high enough for the wafer to have a positive voltage, as was the case in FIG. 6. When the 0.03 μF capacitor was used with the same plasma, no particles were seen either in the plasma or on the wafer during the etching process after an etch time of more than 35 minutes.

Figure 8:
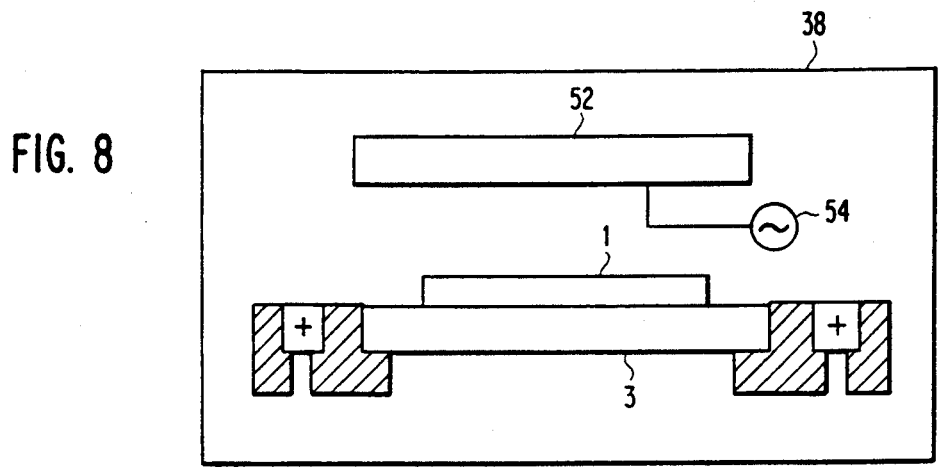
FIG. 8 shows a cross-sectional side view of a particle gettering apparatus in which a low power AC or RF source 54 is connected to an auxiliary electrode in the plasma chamber.

FIG. 8 shows a fourth embodiment of the invention in which a low power AC or RF source 54 is connected to either an electrode 3 on which the wafer 1 is located or an auxiliary electrode 52 is positioned in the plasma chamber 38. In an ECR or magnetized plasma system, as shown in FIGS. 1 and 2, the power may be applied between two electrodes. One electrode should be somewhat parallel to the magnetic field, while the other electrode can either be parallel to the magnetic field or surround the wafer electrode. The frequency of the AC or RF field should be below a 13.56 MHz bias frequency to produce a plasma density of $10^7$–$10^9$ cm$^3$. In a plasma system applying a frequency below the ion plasma frequency (<10 MHz) to any two electrodes exposed to the plasma, the frequency is preferably between 100–400 kHz and in the form of a square or sinusoidal wave. The power source is energized when the main plasma discharge is off. The low power provides a plasma with large sheaths which permit particles to cross the chamber 38 and be gettered at the chamber walls.

Figure 9:
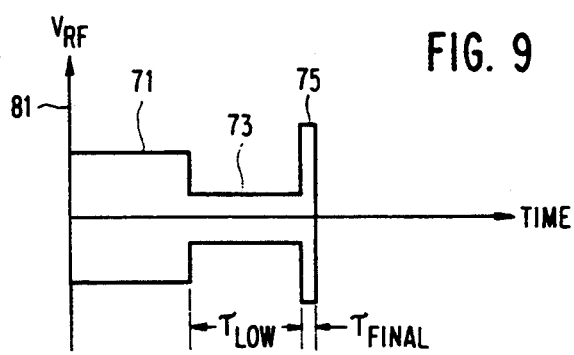
FIG. 9 is a plasma pulse waveform in which the plasma discharge is maintained at a low density to allow particles to cress to the chamber walls and then briefly pulsed to a higher density to drive the wafer electrode to a negative potential and push any remaining particles to the chamber walls.

In a fifth embodiment of the invention, the plasma power is reduced prior to pulsing off the plasma in order to both reduce voltage stress on the films/device or the wafer and to overcome the negative effect of an insulating layer between the wafer and the wafer electrode. This allows the plasma density and the total positive ion charge in the plasma to be reduced. After the ion density is reduced, a very short RF pulse can be applied to the wafer electrode. This will increase the wafer bias without increasing the ion density which, in turn, will impart an impulse to the negative particulates and push them away from the wafer. FIG. 9 shows the plasma pulse waveform produced using this method. Initially, a normal RF amplitude 71 is maintained to generate the plasma. The RF waveform powering the wafer and generating the plasma is then pulsed to a lower level 73 in a manner to maintain a low density plasma on the order of 10–20 ms depending on the constituents of the feed-gas. Finally the RF is briefly pulsed to a higher level 75 just prior to termination of the plasma discharge, thereby replenishing electrons to the plasma and driving the wafer electrode to a negative potential, which will push any remaining particles to the chamber walls. This final pulse should be as short as possible, on the order of 50–100 μs. Experimentation has shown that this method is more desirable than that of the fourth embodiment when electronegative gases are used as a plasma source.

Figure 10:
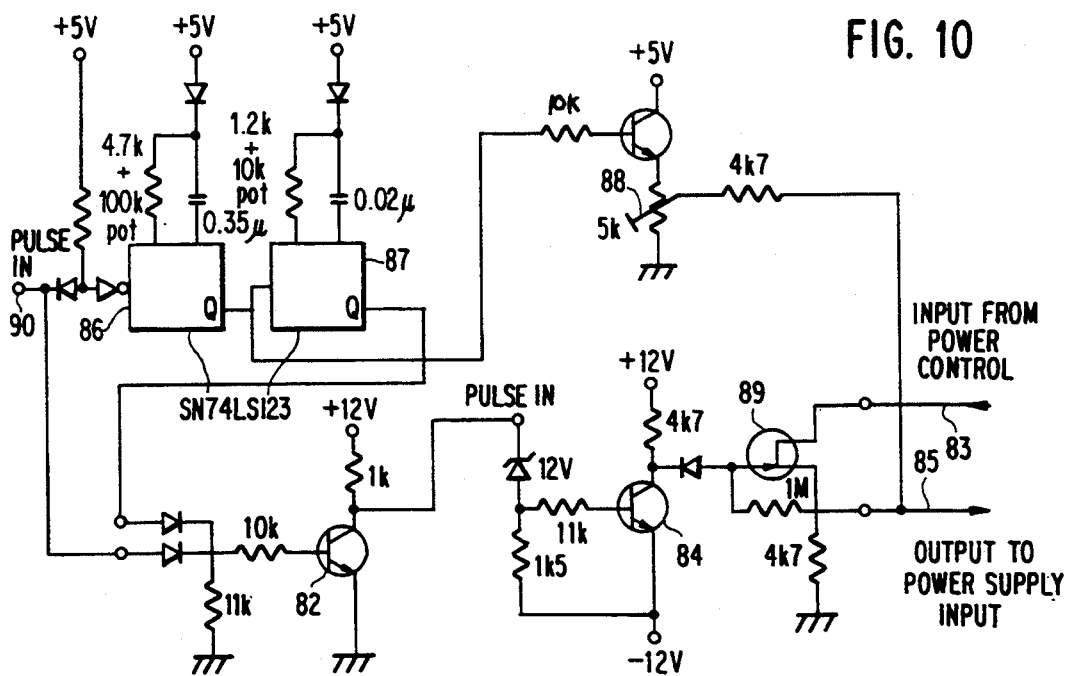
FIG. 10 shows a sample circuit which may be used to produce a pulsed plasma discharge.

A sample timing circuit which produces the pulsed RF of the fifth embodiment is shown in FIG. 10. The circuit is driven by a rectangular wavetrain applied to "pulse in" input 90. This pulse provides power to transistors 82 and 84 which bias a field effect transistor (FET) 89 on. FET 89 performs analog switching, while variable resistance 88 controls the RF power level 73. The DC level on the output 85 is used to control the power level of the RF power supply, and the input 83 is connected to the output of a component which is normally used to control the RF power level. Timing is provided by two monostable multivibrators, or one-shots, 86 and 87. The trailing edge of the pulse applied to input 90 triggers one-shot 86 which, in turn triggers one-shot 87. The time $t_{low}$ is determined by the RC time constant of one-shot 86, and the time $t_{final}$ is determined by the RC time constant of one-shot 87. The RC time constant of one-shot 86 is greater than than that of one-shot 87; hence, the time constant of one-shot 86 maintains the low RF level 73 for a longer period than the high RF level 75 pulse.

Any of the above methods can be combined to sweep out and getter both negative particles and the precursors to particles. They can be used to sweep out particles which the plasma removes from the wafer by electron ion bombardment and the sheath field. These methods can also be used to sweep out flakes which come off the wall both when the plasma is on and when it is off.

While the invention has been described in terms of several preferred embodiments which can be used singly or in combination, those skilled in the art will recognize that the invention can be practiced with modification within the spirit and scope of the appended claims.

Having thus described our invention, what we claim as new and desire to secure by Letters Patent is as follows:

1. In a plasma processing system, a method of preventing particulate from accelerating toward a semiconductor wafer, said method comprising:
    maintaining a negative voltage on said semiconductor wafer referenced to a plasma while the plasma is turned off;
    connecting a power source to an electrode on which said wafer is mounted while the plasma is turned off; and
    preventing, while said plasma is turned off, negatively charged particles in the plasma from being one of accelerated and falling toward a surface of the wafer.

2. In a plasma processing system, a method of maintaining a negative charge on a semiconductor wafer referenced to a plasma ground, said method comprising:
    connecting a power source to an electrode on which said wafer is mounted while the plasma is turned off;
    providing said power source so as to comprise a capacitor connected to said negative electrode through a radio frequency choke; and
    preventing, while said plasma is turned off, negatively charged particles in the plasma from being accelerated toward a surface of the wafer.

3. In a plasma processing system, a method of maintaining a negative charge on a semiconductor wafer referenced to a plasma ground, said method comprising:
    connecting a power source to an electrode on which said wafer is mounted while the plasma is turned off;
    providing said power source so as to comprise a power supply and diode; and
    preventing, while said plasma is turned off, negatively charged particles in the plasma from being accelerated toward a surface of the wafer.

4. A method of gettering negatively charged particles and ions trapped in a plasma sheath produced in a plasma processing system used in the manufacture of semiconductor circuits, wherein a semiconductor wafer is mounted on a negative electrode and exposed to a radio frequency generated plasma discharge, said negative electrode having a potential less than that of the plasma, said method comprising the steps of:
    generating an electric field adjacent said negative electrode on which the semiconductor wafer is mounted; and
    generating a magnetic field transverse to the electric field, negatively charged particles and ions being drawn to a positive electrode and thereby gettered from the plasma and the semiconductor wafer, said positive electrode having a potential greater than that of the plasma of said plasma discharge and being positioned adjacent said negative electrode on which the semiconductor wafer is mounted,
    said negatively charged particles being negatively charged by said plasma.

5. A method of gettering negatively charged particles and ions trapped in a plasma sheath produced in a plasma processing system used in the manufacture of semiconductor circuits, wherein a semiconductor wafer is mounted on a negative electrode and exposed to a radio frequency generated plasma discharge, comprising the steps of;

generating an electric field adjacent said negative electrode on which the semiconductor wafer is mounted;

generating a magnetic field transverse to the electric field, negatively charged particles and ions being drawn to said positive electrode and thereby gettered from the plasma and the semiconductor wafer; and turning said plasma discharge off at periods which are short to the process time for a period which is long to the plasma decay time.

6. A method of gettering negatively charged particles and ions trapped in a plasma sheath produced in a plasma processing system used in the manufacture of semiconductor circuits, wherein a semiconductor wafer is mounted on a negative electrode and exposed to a radio frequency generated plasma discharge, comprising the steps of:

generating an electric field adjacent said negative electrode on which the semiconductor wafer is mounted;

generating a magnetic field transverse to the electric field negatively charged particles and ions being drawn to said positive electrode and thereby gettered from the plasma and the semiconductor wafer; and pulsing said negative electrode more negative when said plasma discharge is turned off.

7. A method of gettering negatively charged particles and ions trapped in a plasma sheath produced in a plasma processing system used in the manufacture of semiconductor circuits, wherein a semiconductor wafer referenced to a plasma ground is mounted on a negative electrode and exposed to a radio frequency generated plasma discharge, said method comprising the steps of:

turning off said radio frequency generated plasma discharge;

biasing negative an electrode connected to said negative electrode, and maintaining a negative potential on said negative electrode when said plasma discharge is turned off; and preventing, while said plasma discharge is turned off, negatively charged particles in the plasma from being accelerated toward a surface of the wafer, said particles having a mass greater than that of electrons.

8. A method of gettering negatively charged particles and ions trapped in a plasma sheath produced in a plasma processing system used in the manufacture of semiconductor circuits, wherein a semiconductor wafer is mounted on a negative electrode and exposed to a first radio frequency generated plasma discharge, comprising the steps of:

turning off said first radio frequency generated plasma discharge; and generating a second radio frequency plasma discharge having a lower frequency and power than said first radio frequency generated plasma discharge for a short time before or after termination of said plasma discharge.

9. The method recited in claim 8, further comprising the step of maintaining said plasma discharge at a reduced power level and providing a pulse of a normal power level.

* * * * *